(12) United States Patent
Wang et al.

(10) Patent No.: US 10,903,338 B2
(45) Date of Patent: *Jan. 26, 2021

(54) VERTICAL FET WITH SHAPED SPACER TO REDUCE PARASITIC CAPACITANCE

(71) Applicant: INTERNATIONAL BUSINESS MACHINES CORPORATION, Armonk, NY (US)

(72) Inventors: Junli Wang, Slingerlands, NY (US); Kangguo Cheng, Schenectady, NY (US); Theodorus E. Standaert, Clifton Park, NY (US); Veeraraghavan S. Basker, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/684,050

(22) Filed: Nov. 14, 2019

(65) Prior Publication Data
US 2020/0083347 A1    Mar. 12, 2020

Related U.S. Application Data

(63) Continuation of application No. 15/838,890, filed on Dec. 12, 2017, now Pat. No. 10,672,887.

(51) Int. Cl.
*H01L 29/66* (2006.01)
*H01L 29/423* (2006.01)
*H01L 29/78* (2006.01)

(52) U.S. Cl.
CPC .... *H01L 29/6656* (2013.01); *H01L 29/42364* (2013.01); *H01L 29/66666* (2013.01); *H01L 29/7827* (2013.01)

(58) Field of Classification Search
CPC ....... H01L 21/823487; H01L 29/41741; H01L 29/42364; H01L 29/66553; H01L 29/6656; H01L 29/66666; H01L 29/7827; H01L 29/78642
See application file for complete search history.

(56) References Cited

U.S. PATENT DOCUMENTS

| | | |
|---|---|---|
| 5,250,450 A | 10/1993 | Lee et al. |
| 6,156,611 A | 12/2000 | Lan et al. |
| 6,693,013 B2 | 2/2004 | Bae et al. |
| 7,488,659 B2 | 2/2009 | Dyer |
| 7,871,869 B2 | 1/2011 | Cartier et al. |

(Continued)

OTHER PUBLICATIONS

List of IBM Patents or Patent Applications Treated as Related dated Nov. 14, 2019, 2 pages.

*Primary Examiner* — David C Spalla
(74) *Attorney, Agent, or Firm* — Tutunjian & Bitetto, P.C.; Randall Bluestone

(57) ABSTRACT

A vertical transistor includes a first source/drain region and a second source/drain region vertically disposed relative to the first source/drain region and coupled to the first source/drain region by a fin. A gate dielectric is formed on the fin, and a gate conductor is formed on the gate dielectric in a region of the fin. A shaped spacer is configured to cover a lower portion and sides of the second source/drain region to reduce parasitic capacitance between the gate conductor and the second source/drain region.

20 Claims, 6 Drawing Sheets

(56) References Cited

U.S. PATENT DOCUMENTS

| | | | |
|---|---|---|---|
| 8,404,592 B2 | 3/2013 | Luning et al. | |
| 9,252,018 B2 | 2/2016 | Mo et al. | |
| 9,299,835 B1 | 3/2016 | Anderson et al. | |
| 9,368,572 B1 | 6/2016 | Cheng et al. | |
| 9,397,226 B2 | 7/2016 | Basu et al. | |
| 9,716,170 B1 | 7/2017 | Cheng et al. | |
| 10,236,363 B2* | 3/2019 | Xie | H01L 29/41791 |
| 10,236,380 B2* | 3/2019 | Basker | H01L 29/66666 |
| 10,672,887 B2* | 6/2020 | Wang | H01L 29/6656 |
| 2004/0121546 A1 | 6/2004 | Yoo | |
| 2017/0317211 A1 | 11/2017 | Kim | |
| 2017/0365673 A1* | 12/2017 | Cheng | H01L 29/0649 |
| 2018/0269312 A1* | 9/2018 | Xie | H01L 29/7827 |
| 2019/0181238 A1* | 6/2019 | Wang | H01L 29/66666 |

* cited by examiner

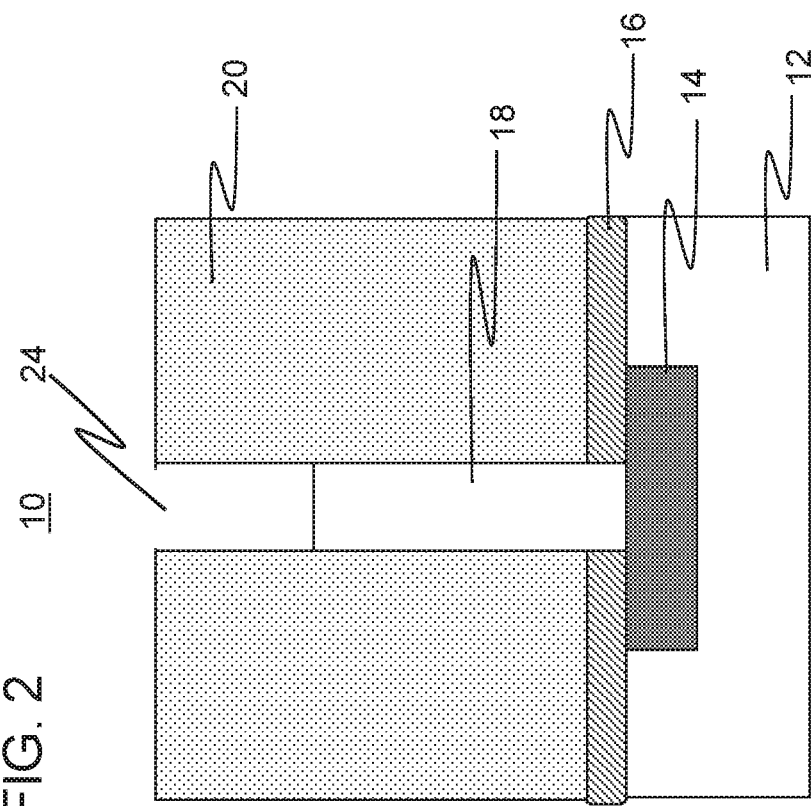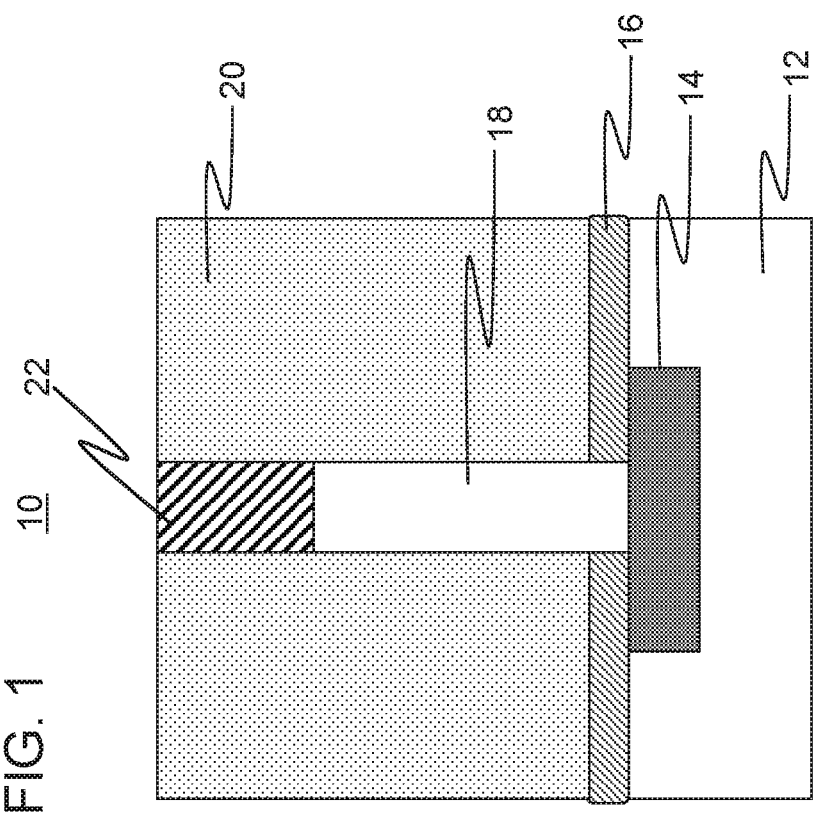

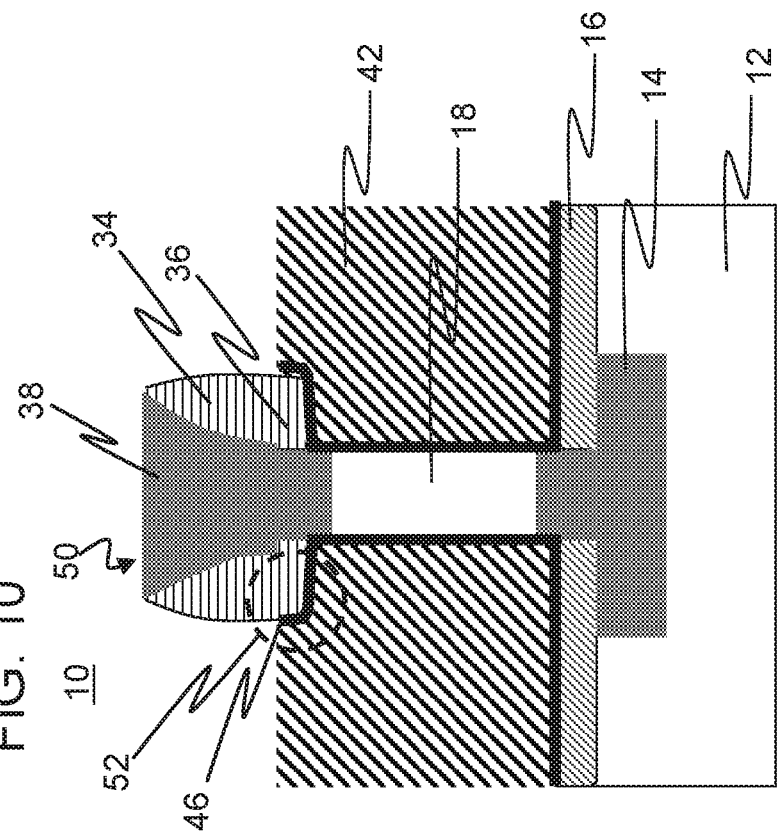
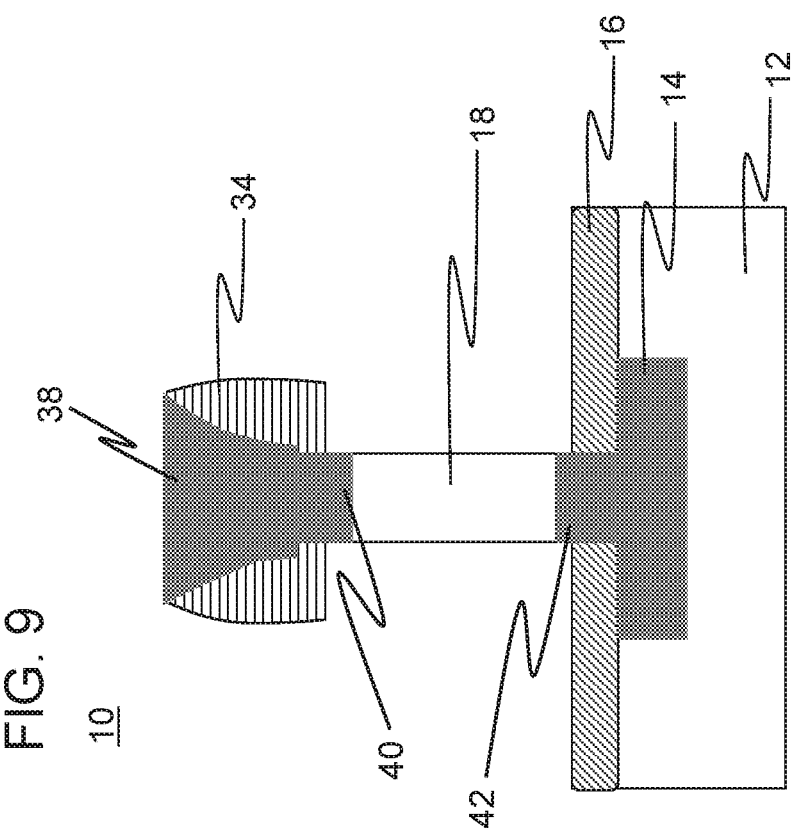

_US 10,903,338 B2_

VERTICAL FET WITH SHAPED SPACER TO REDUCE PARASITIC CAPACITANCE

BACKGROUND

Technical Field

The present invention generally relates to semiconductor processing, and more particularly to methods and structures which reduce parasitic capacitance in vertical field effect transistors.

Description of the Related Art

Vertical field effect transistors (VFETs) provide reduced chip area and provide a viable complementary metal oxide semiconductor (CMOS) architecture, in particular, for node sizes of 7 nm and beyond. One issue with VFETs is increased parasitic capacitance due to direct overlapping of drain epitaxy with gate conductors. These materials are typically separated by thin spacers and a high-k gate dielectric. However, parasitic capacitance remains significant and can affect device performance.

SUMMARY

In accordance with an embodiment of the present invention, a vertical transistor includes a first source/drain region and a second source/drain region vertically disposed relative to the first source/drain region and coupled to the first source/drain region by a fin. A gate dielectric is formed on the fin, and a gate conductor is formed on the gate dielectric in a region of the fin. A shaped spacer is configured to cover a lower portion and sides of the second source/drain region to reduce parasitic capacitance between the gate conductor and the second source/drain region.

A method for forming a vertical transistor includes depositing a dielectric layer around a fin and a dielectric cap on the fin; removing the cap to form an opening in the dielectric layer over the fin; etching the dielectric layer in the opening to form contoured side walls; forming a spacer form in the opening; recessing the dielectric layer to below the spacer form and to expose a portion of the fin; forming a shaped spacer about the spacer form; replacing the spacer form with a source/drain region grown on the fin; replacing the dielectric layer with a conformally formed gate dielectric and a gate conductor over the gate dielectric; recessing the gate conductor to a position on the shaped spacer; and etching the gate dielectric to a level of the gate conductor.

Another method for forming a vertical transistor includes forming a semiconductor fin with a cap thereon; forming a first source/drain region below the fin; depositing a dielectric layer around the fin and the cap; removing the cap to form an opening in the dielectric layer over the fin; etching the dielectric layer in the opening to form contoured side walls; forming a spacer form in the opening; recessing the dielectric layer to below the spacer form and to expose a portion of the fin; forming a shaped spacer by depositing and etching a spacer material, the shaped spacer surrounding sides and a portion of a bottom of the spacer form; replacing the spacer form with a second source/drain region grown on the fin; removing the dielectric layer; conformally forming a gate dielectric; forming a gate conductor over the gate dielectric; recessing the gate conductor to a position on the shaped spacer; and etching the gate dielectric to a level of the gate conductor.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a cross-sectional view of a partially fabricated semiconductor device showing a source/drain region formed in a substrate below a fin, the fin having a cap formed thereon and being buried in a dielectric layer in accordance with an embodiment of the present invention;

FIG. 2 is a cross-sectional view of the partially fabricated semiconductor device of FIG. 1 showing the cap removed to form an opening in the dielectric layer in accordance with an embodiment of the present invention;

FIG. 9 is a cross-sectional view of the partially fabricated semiconductor device of FIG. 8 showing the dielectric layer stripped away in accordance with an embodiment of the present invention;

FIG. 10 is a cross-sectional view of the partially fabricated semiconductor device of FIG. 9 showing a gate dielectric and a gate conductor deposited to form a vertical field effect transistor in accordance with an embodiment of the present invention.

DETAILED DESCRIPTION

Figure 4:
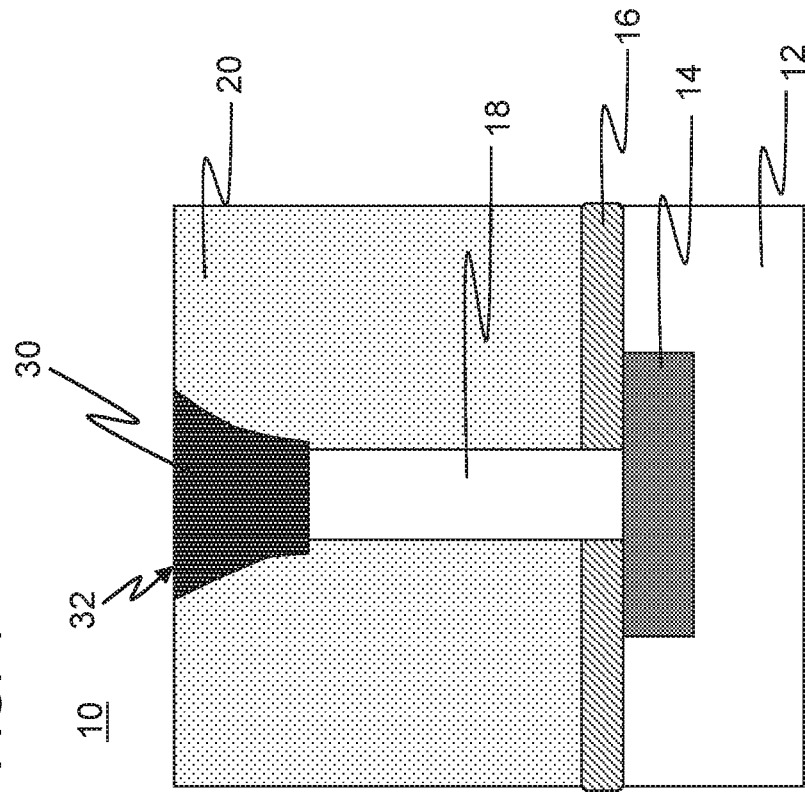
FIG. 4 is a cross-sectional view of the partially fabricated semiconductor device of FIG. 3 showing a spacer form provided in the opening of the dielectric layer in accordance with an embodiment of the present invention.

Aspects of the present invention address parasitic capacitance issues in vertical transistor devices. Methods and structures are provided that form a spacer shaped to ensure adequate dielectric between a drain region and a gate conductor. It should be understood that while the present embodiments will be described in terms of a drain region, the drain region may be interchanged with a source region or the region can be referred to generally as a source/drain (S/D) region.

In useful implementations, a spacer is formed using a patterned opening and shaped to add sufficient dielectric material between regions where parasitic capacitance would be high. In one embodiment, the spacer includes an L-shaped cross-section to form a cup-like structure about a source/drain region. The spacer can provide for both horizontal and vertical electrical isolation of its corresponding S/D region. In addition, the processing of the spacer includes flexibility in fashioning its shape to ensure proper handling of parasitic capacitance and other properties.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated semiconductor device 10 is shown in accordance with one embodiment. The device 10 includes a substrate 12 having multiple layers formed thereon. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC and/or multi-layers thereof. Although silicon is the predominantly used semiconductor material in wafer fabrication, alternative semiconductor materials can be employed as well, such as, but not limited to, germanium, gallium arsenide, gallium nitride, silicon germanium, cadmium telluride, zinc selenide, etc. In other embodiments, the substrate 12 can include multiple layers of the same or different semiconductor materials.

In one or more embodiments, a hardmask layer 22 may be formed on an exposed surface of the substrate 12. A photo mask layer (not shown) may be formed on the exposed surface of the hardmask layer 22. In various embodiments, the hardmask layer 22 may be an oxide, for example, silicon oxide (SiO), a nitride, for example, a silicon nitride (SiN), or an oxynitride, for example, silicon oxynitride (SiON), SiOC, SiOCN, SiCN, SiBCN, or any suitable of combination of multiple materials. In various embodiments, the photo mask layer may be a temporary resist (e.g., PMMA) that may be deposited on the hardmask layer 22, patterned, and developed. The photo mask layer may be a positive resist or a negative resist.

The photo mask layer may be patterned and developed to form photo mask blocks covering at least a portion of the surface of the hardmask layer 22. The photo mask blocks protect the covered portion of the hardmask layer 22, while exposed portions of the hardmask layer 22 are etched to form hardmask fin templates on the substrate 12. One or more photo mask blocks may define the width, length, and pitch of the one or more hardmask fin templates and thereby, the width, length, and pitch of the one or more vertical fins.

In one or more embodiments, the hardmask layer 22 may be etched to form a fin template. A reactive ion etch (RIE) is performed to etch fins 18 into the substrate 12. The photo mask can be removed during or after the RIE. The photo mask can be removed by known stripping methods. A vertical fin 18 can be formed from the substrate 12 by etching the substrate 12 between portions of the hardmask 22. The substrate 12 can be etched by the RIE to provide a directional etch with control of sidewall etching. In various embodiments, the substrate 12 may be etched using a dry plasma etch. It should be understood that other methods are contemplated for the formation of monocrystalline fins on the substrate. Such methods can include growing the fins, employing other patterning techniques, etc. Alternatively, other patterning techniques such as sidewall image transfer (SIT), self-aligned double patterning (SADP), self-aligned quadruple patterning (SAQP) can be used to form fins.

In one or more embodiments, a doped region 14 (e.g., S/D region) can be formed in the substrate 12. The doped region 14 can be formed below the vertical fin(s) 18. The dopant for the dopant region 14 may be provided to the doped region(s) (e.g., S/D region 14) by ion implantation, diffusion using a diffusion layer with and anneal, in-situ doped epitaxy, gas phase doping, plasma doping, plasma immersion ion implantation, cluster doping, infusion doping, liquid phase doping, solid phase doping, etc. In any event, the doped region(s) 14 can be annealed to form a source/drain region. In various embodiments, the doped region 14 can be n-doped or p-doped. The doped region 14 can form a bottom source/drain. It should be noted that the source and drain can be interchangeable between the top and bottom locations of a vertical fin, where the doped region in the substrate 12 may act as a source or a drain. The S/D region 14 can be formed before or after the formation of fins.

A bottom spacer 16 can be formed on the exposed surface of the substrate 12. The bottom spacer 16 may be an oxide, for example, silicon oxide (SiO), a nitride, for example, a silicon nitride (SiN), or an oxynitride, for example, silicon oxynitride (SiON), SiOC, SiOCN, SiCN, SiBCN, or any suitable combination of those materials. The thickness of the bottom spacer 16 may define a distance between the surface of the substrate to the start of a gate structure. The bottom spacer 16 can be formed using chemical vapor deposition (CVD), plasma enhanced CVD (PECVD), physical vapor deposition (PVD), high-density plasma CVD, atomic layer deposition (ALD), a spin-on glass process, etc.

A dielectric layer 20 is deposited over the fin 18 and hardmask (cap) 22. The dielectric layer 20 is selectively etchable relative to the bottom spacer 16. The dielectric layer 20 can be an oxide, for example, silicon oxide (SiO), a nitride, for example, a silicon nitride (SiN), or an oxynitride, for example, silicon oxynitride (SiON), or any suitable combination of materials. The dielectric layer 20 can be formed using CVD, PECVD, PVD, high-density plasma CVD, ALD, a spin-on glass process, etc.

The dielectric layer 20 is planarized to remove excess material over the cap 22. The planarization process can include an etch process or a chemical mechanical polish (CMP) process.

Referring to FIG. 2, the cap 22 is removed from the top of the fin 18 by a selective etch process. The etch process can include a wet or dry etch. The top of the fin 18 is exposed through an opening 24.

Figure 3:
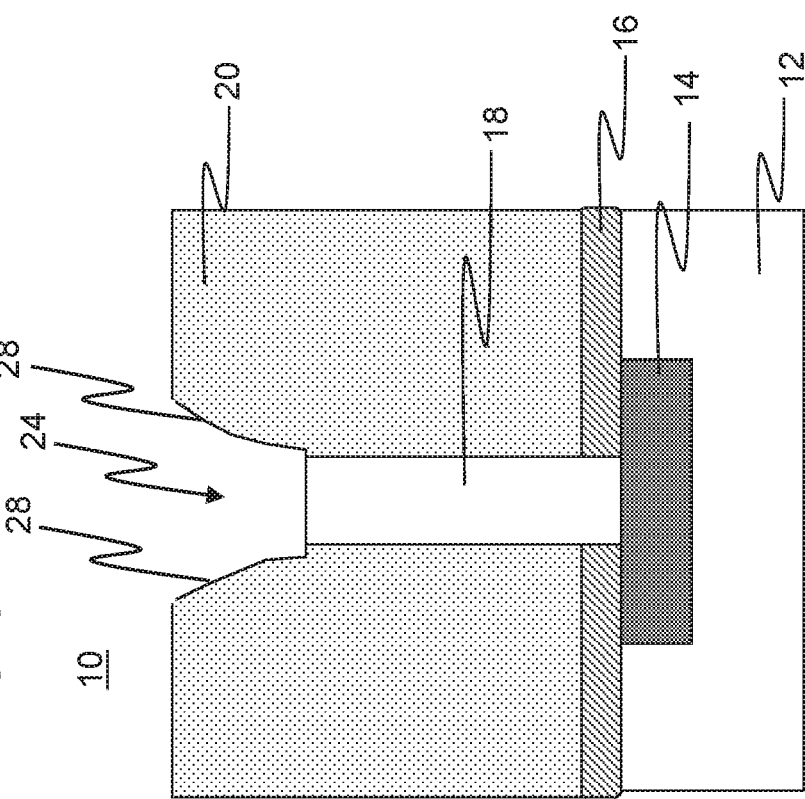
FIG. 3 is a cross-sectional view of the partially fabricated semiconductor device of FIG. 2 showing the dielectric layer etched to form contoured sidewalls in the opening of the dielectric layer in accordance with an embodiment of the present invention.

Referring to FIG. 3, an etch process is performed to shape sides 28 of the dielectric layer 20 adjacent to the opening 24. In one embodiment, the etch process can include a chemical oxide removal (COR) process. The COR process further opens the dielectric layer 20 (e.g., oxide) on top of the fin 18. The exposure of the dielectric layer 20 to the COR process widens more toward a top surface than at a bottom of the opening 24. In this way, a funnel-like shape is created. Other suitable techniques to erode the corner of the dielectric layer 20 can be used to create the funnel-like shape. Such techniques can include but are not limited to, angled sputtering, angled ion bombardment, etc. It should be understood that the selection of the etch rate, etch chemistry, etch duration, etch process, etc. can be varied to achieve a desired shape of the opening 24 and sides 28.

Referring to FIG. 4, a deposition process is performed to deposit a filler material 32 that fills the opening 24. The filler material 32 is then planarized, e.g., CMP, to create a spacer form 30. The spacer form 30 will be employed to provide a shape for a spacer to be formed. The spacer material 32 can include a material that can provide etch selectivity as against the dielectric layer 20. The spacer material 32 can include, e.g., amorphous carbon, polysilicon or other suitable materials.

Figure 5:
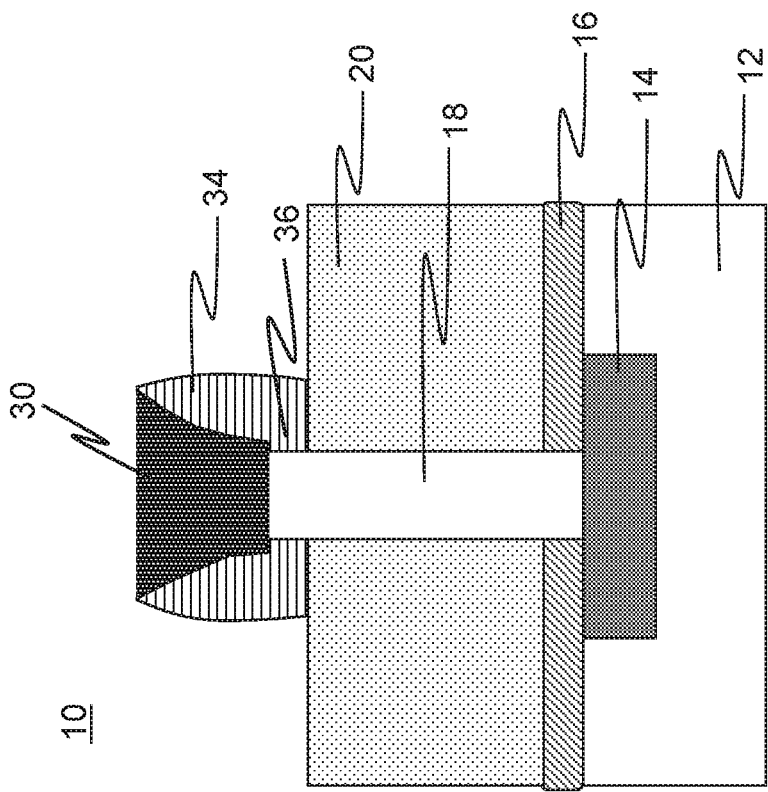
FIG. 5 is a cross-sectional view of the partially fabricated semiconductor device of FIG. 4 showing the dielectric layer recessed to expose the spacer form in accordance with an embodiment of the present invention.

Referring to FIG. 5, a recess process is performed to recess the dielectric layer 20 to a level below the form 30. The recess level can lower the surface of the dielectric layer 20 to expose a portion of the fin 18. The recess process can be performed using any suitable etch process, wet or dry. The recess process is selective to the material of the form 30 and the fin 18.

Figure 6:
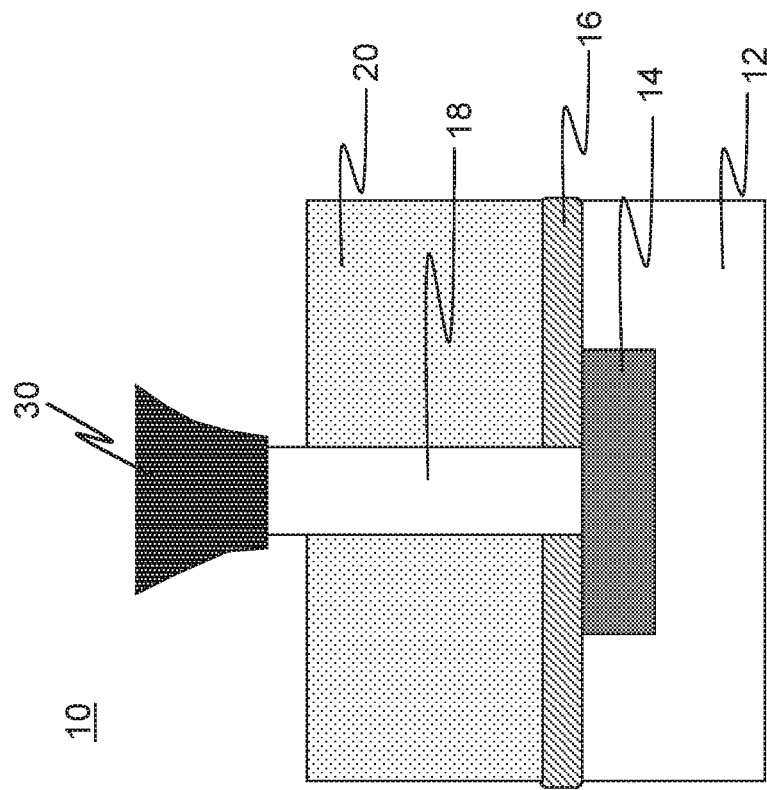
FIG. 6 is a cross-sectional view of the partially fabricated semiconductor device of FIG. 5 showing a shaped spacer formed about the spacer form in accordance with an embodiment of the present invention.

Referring to FIG. 6, a shaped spacer 34 is formed. The shaped spacer 34 can be formed by depositing a conformal layer of dielectric material, such as, an oxide, nitride, oxynitride, SiBCN, SiOCN, SiCN, SiOC, etc. on the form 30 and the dielectric layer 20. The conformal layer is then etched by an etch process (e.g., RIE) that removes the conformal layer from surfaces except for the sidewalls of the form 30. The profile of the form 30 defines a shape of the shaped spacer 34. In one embodiment, the exposed fin 18 below the form creates an L-shaped profile 36 that ensures that dielectric material covers lower surfaces of the form 30 and is in contact with the fin 18. It should be understood that other profiles and shapes of the shaped spacer 34 can also be employed.

Figure 7:
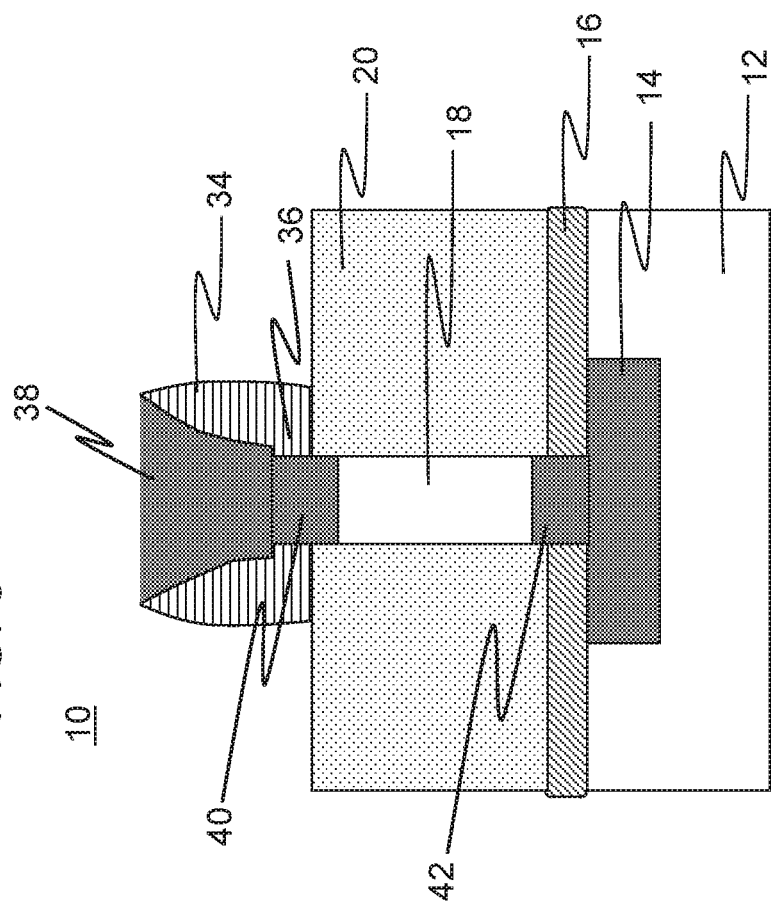
FIG. 7 is a cross-sectional view of the partially fabricated semiconductor device of FIG. 6 showing the spacer form replaced by an epitaxially grown source/drain region in accordance with an embodiment of the present invention.

Referring to FIG. 7, the form 30 is removed by a selective etch process. The selective etch process can include a selective wet of dry etch process. The form 30 is removed, which exposes a top of the fin 18. The fin 18 can include a monocrystalline material, which enables the formation of an epitaxially grown S/D region 38. The epitaxially grown S/D region 38 can be a drain (or source) region for a vertical transistor. Epitaxially grown S/D region 38 is formed within the shaped spacer 34.

S/D epitaxy to form S/D region 38 can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 8:
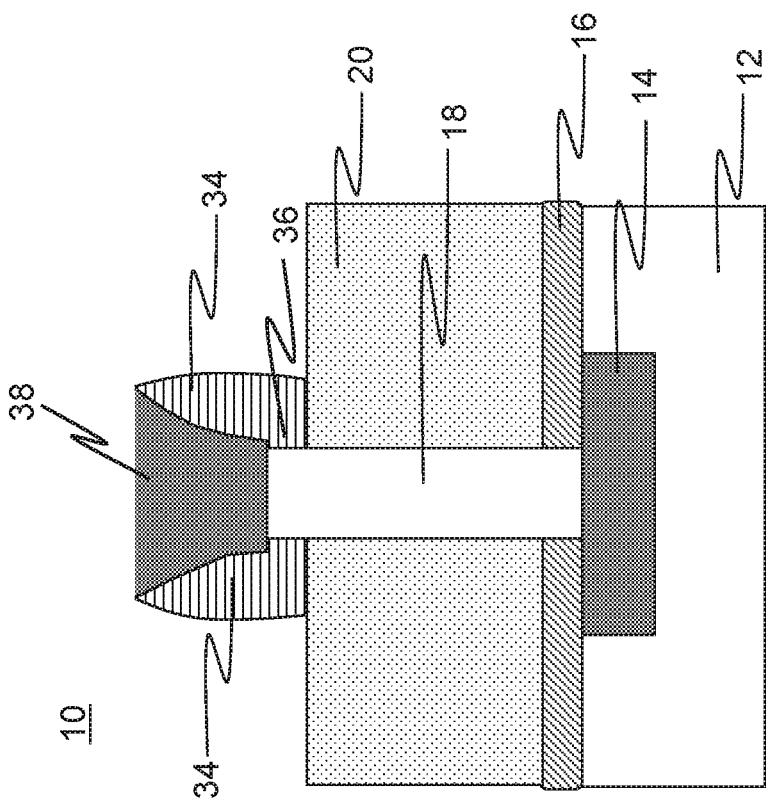
FIG. 8 is a cross-sectional view of the partially fabricated semiconductor device of FIG. 7 showing extension regions formed in the fin as a result of an anneal process in accordance with an embodiment of the present invention.

Referring to FIG. 8, an anneal process can be performed to anneal S/D regions 28 and 14 to form extension regions 40 and 42, respectively. The anneal process can include any standard anneal that include temperatures and durations in line with a thermal budget for the device 10. The extension regions 40 and 42 are formed by diffusing dopants from the S/D regions 38 and 14 into adjacent regions of the fin 18. The S/D regions 14 and 38 can be doped during deposition (in-situ) and can include enough dopants to provide a dopant concentration sufficient for the extension regions 40, 42 after the anneal.

Referring to FIG. 9, the dielectric layer 20 is stripped away by a selective etch process. The selective etch process can include a dry or wet etch that can selectively remove the dielectric layer 20 relative to the fin 18, spacers 16, shaped spacer 34 and S/D region 38.

Referring to FIG. 10, a gate dielectric 46 is deposited conformally over the device 10. A gate conductor 42 is also deposited and recessed by a selective etch to a position within a height of the shaped spacer 34. The gate dielectric 46 is removed to a recessed level of the gate conductor 42 to form a vertical transistor 50.

The gate dielectric 46 can include a high-k dielectric layer. The high-k dielectric layer may include but is not limited to metal oxides such as hafnium oxide (e.g., HfO$_2$), hafnium silicon oxide (e.g., HfSiO$_4$), hafnium silicon oxynitride (Hf$_w$Si$_x$O$_y$N$_z$), lanthanum oxide (e.g., La$_2$O$_3$), lanthanum aluminum oxide (e.g., LaAlO$_3$), zirconium oxide (e.g., ZrO$_2$), zirconium silicon oxide (e.g., ZrSiO$_4$), zirconium silicon oxynitride (Zr$_w$Si$_x$O$_y$N$_z$), tantalum oxide (e.g., TaO$_2$, Ta$_2$O$_5$), titanium oxide (e.g., TiO$_2$), barium strontium titanium oxide (e.g., BaTiO$_3$—SrTiO$_3$), barium titanium oxide (e.g., BaTiO$_3$), strontium titanium oxide (e.g., SrTiO$_3$), yttrium oxide (e.g., Y$_2$O$_3$), aluminum oxide (e.g., Al$_2$O$_3$), lead scandium tantalum oxide (Pb(Sc$_x$Ta$_{1-x}$)O$_3$), and lead zinc niobate (e.g., PbZn$_{1/3}$Nb$_{2/3}$O$_3$). The high-k material may further include dopants such as lanthanum and/or aluminum. The stoichiometry of the high-k compounds may vary. In some embodiments, multiple layers of the gate dielectric can be employed.

In various embodiments, a work function layer or other layers may be formed over the gate dielectric layer(s) 46 and may include a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

The gate conductor 42 can be formed on the work function layer, etc. or the gate dielectric 46. The gate conductor 42 can be deposited by CVD, sputtering, PVD, or any suitable deposition process.

The gate conductor 42 includes conductive materials, such as, e.g., polycrystalline or amorphous silicon, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotubes, conductive carbon, graphene, or any suitable combination of these materials. The conductive material may further comprise dopants that are incorporated during or after deposition.

Processing can continue with the formation of interlevel dielectric materials, contacts and other back end of the line (BEOL) processing. The VFET 52 conducts vertically through the fin 18 between S/D regions 14 and 38 when the gate conductor 42 receives a threshold voltage for the VFET device (10). The shaped spacer 34 reduces gate-to-top S/D region parasitic capacitance. In one embodiment, the shaped spacer 34 and the gate dielectric 46 in region 52 (all around the fin 18) provide ample dielectric material to reduce parasitic capacitance. Furthermore, the shaped spacer 34 improves the tolerance of metal gate recess. Even if the gate conductor 42 has a recess level that is slightly above the bottom of the shaped spacer 34, parasitic capacitance is still maintained at acceptable levels due to the wide base of the L shaped region 36 of the shaped spacer 34. The L-shaped region 36 can have a radial width (from fin to outer surface) at least equal to about the fin width, although other larger or smaller dimensions are contemplated.

In one example, parasitic capacitance C1 was estimated for a conventional vertical field effect transistor having a top spacer separating a gate conductor and a top S/D region device. The conventional structure included a 6 nm wide fin for a device with a fin pitch of about 40 nm. Parasitic capacitance C2 was estimated for a vertical field effect transistor in accordance with the present embodiments having a shaped spacer (34) separating a gate conductor and a top S/D region device. The novel structure also included a 6 nm wide fin for a device with a fin pitch of about 40 nm. An illustrative comparison showed a reduction in the parasitic capacitance of at least about C2/C1=65%. This computation is merely illustrative of the improvements achieved in accordance with aspects of the present invention.

Figure 11:
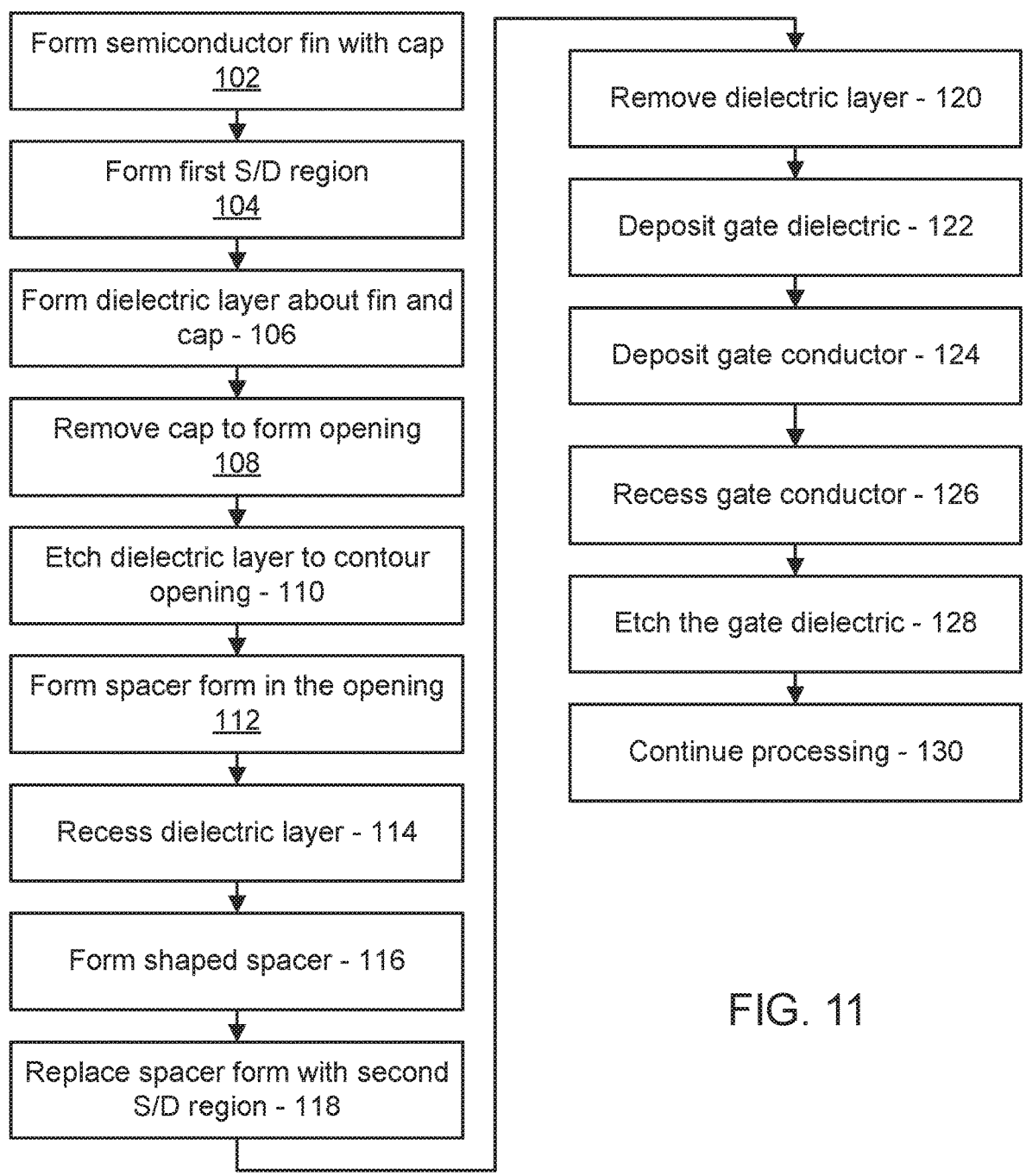
FIG. 11 is a block/flow diagram showing methods for fabricating a vertical transistor with a shaped spacer in accordance with embodiments of the present invention.

Referring to FIG. 11, methods for forming a vertical transistor with a shaped spacer are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a semiconductor fin is formed on a substrate. The substrate can include a bulk substrate or a semiconductor on insulator (SOI) substrate. The fins can be etched into the substrate using a cap or hardmask layer formed thereon. The hard mask can be patterned using lithographic patterning techniques. The etch process can include a directional etch, such as, e.g., RIE.

In block 104, a first source/drain region can be formed below the fin. This can include a dopant implantation process. The first source/drain region can include a source region although in some embodiments, it may be a drain region. If a source region is formed in the substrate, the source can be common to multiple fins.

In block 106, a dielectric layer is deposited around/about the fin and the cap. The dielectric layer is sacrificial and will be removed in later steps.

In block 108, the cap is removed from on top of the fin to form an opening in the dielectric layer over the fin. The cap can be removed using a selective etch process.

In block 110, the dielectric layer is etched in the opening to form contoured side walls. The etch can include, e.g., a COR etch. The contoured sidewalls can be shaped in accordance with the etch process. For example, the contoured walls can be curved in or out depending on the etching parameters. The etching of the dielectric layer in the opening to form the contoured side walls can include etching a funnel-like shape in the dielectric layer to define a shape of the second source/drain region.

In block 112, a spacer form is formed in the opening. This can include depositing a material in the opening and planarizing the material down to a top surface of the dielectric layer. The material can include amorphous carbon, although other materials, e.g., polysilicon can be employed.

In block 114, the dielectric layer is recessed to below the spacer form. A portion (e.g., upper portion) of the fin can be exposed as well.

In block 116, a shaped spacer is formed by depositing and etching a spacer material. The shaped spacer surrounds sides and a portion of a bottom of the spacer form. The spacer can be shaped using the spacer form and by adjusting the deposition and etching processes of the spacer material. The shaped spacer can include an annular configuration wherein the fin is disposed centrally within at least a portion of the shaped spacer and wherein the shaped spacer contacts the fin at the lower portion of the shaped spacer and a wall of the shaped spacer can include an L-shaped profile.

In block 118, the spacer form is replaced with a second source/drain region grown on the fin. This includes removing the spacer form by a selective etch process, which can clean the top of the fin. The top of the fin is employed as a seed template for epitaxially growing the second source/drain region (e.g., drain).

In block 120, the dielectric layer is removed selectively to other structures. The dielectric layer can be etched to remove the dielectric layer from the fin.

In block 122, a gate dielectric is conformally formed over the device. The gate dielectric can include a high-k material and can include one or more layers.

In block 124, a gate conductor is formed over the gate dielectric. The gate conductor can include one or more conductive layers.

In block 126, the gate conductor is recessed to a position on the shaped spacer. The position tolerance for the position of a recessed surface of the gate conductor is opened up (increased) as a result of the use of the shaped spacer.

In block 128, the gate dielectric is etched where exposed to a level of the gate conductor.

In block 130, the processing continues (e.g., BEOL) to complete the device.

Having described preferred embodiments for vertical FET with shaped spacer to reduce parasitic capacitance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transistor, comprising:
a shaped spacer configured to cover a first portion of a second source/drain region facing a first source/drain region and a second portion of the second source/drain region extending perpendicular to the first portion; and
a gate structure having a gate dielectric conformally formed on a fin and along the shaped spacer to a region of the shaped spacer in parallel with the second portion.

2. The vertical transistor as recited in claim 1, wherein the shaped spacer includes an annular configuration wherein the fin is disposed centrally within at least a portion of the shaped spacer.

3. The vertical transistor as recited in claim 2, wherein the shaped spacer contacts the fin at the lower portion of the shaped spacer.

4. The vertical transistor as recited in claim 1, wherein the shaped spacer includes a funnel-like interior shape and the second source/drain region includes a funnel-like shape corresponding to the interior shape of the shaped spacer.

5. The vertical transistor as recited in claim 1, wherein the gate dielectric is disposed between the shaped spacer and the gate conductor.

6. The vertical transistor as recited in claim 1, wherein a wall of the shaped spacer includes an L-shaped profile.

7. A method for forming a vertical transistor, comprising:
covering, with a shaped spacer, a first portion of a second source/drain region facing a first source/drain region and a second portion of the second source/drain region extending perpendicular to the first portion; and
conformally forming a gate structure having a gate dielectric on a fin and along the shaped spacer to a region of the shaped spacer in parallel with the second portion.

8. The method as recited in claim 7, further comprising diffusing dopants from the first source/drain region and the second source/drain region into the fin to form extension regions.

9. The method as recited in claim 8, wherein diffusing dopants to form the extension regions includes an annealing process.

10. The method as recited in claim 9, wherein the first source/drain region and the second source/drain region include excess dopant to provide a dopant concentration sufficient for the extension regions after the annealing process.

11. The method as recited in claim 7, wherein forming the second source/drain region includes forming the second source/drain region with a funnel-like shape.

12. The method as recited in claim 7, wherein the shaped spacer includes an annular configuration wherein the fin is disposed centrally within at least a portion of the shaped spacer and wherein the shaped spacer contacts the fin at a lower portion of the shaped spacer.

13. The vertical transistor as recited in claim 7, wherein a wall of the shaped spacer includes an L-shaped profile.

14. A method for forming a vertical transistor, comprising:
covering, with a shaped spacer, a first portion of a second source/drain region facing a first source/drain region and a second portion of the second source/drain region extending perpendicular to the first portion;
conformally forming a gate structure having a gate dielectric on a fin and the shaped spacer; and
etching the gate dielectric to a level of the gate conductor.

15. The method as recited in claim 14, further comprising diffusing dopants from the first source/drain region and the second source/drain region into the fin to form extension regions.

16. The method as recited in claim 15, wherein diffusing dopants to form the extension regions includes an annealing process.

17. The method as recited in claim 16, wherein the first source/drain region and the second source/drain region include excess dopant to provide a dopant concentration sufficient for the extension regions after the annealing process.

18. The method as recited in claim 14, wherein forming the second source/drain region includes forming the second source/drain region with a funnel-like shape.

19. The method as recited in claim 14, wherein the shaped spacer includes an annular configuration wherein the fin is disposed centrally within at least a portion of the shaped spacer and wherein the shaped spacer contacts the fin at a lower portion of the shaped spacer.

20. The vertical transistor as recited in claim 14, wherein a wall of the shaped spacer includes an L-shaped profile.

* * * * *